United States Patent
Hellig

(10) Patent No.: US 6,703,297 B1
(45) Date of Patent: Mar. 9, 2004

(54) METHOD OF REMOVING INORGANIC GATE ANTIREFLECTIVE COATING AFTER SPACER FORMATION

(75) Inventor: Kay Hellig, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 58 days.

(21) Appl. No.: 10/104,461

(22) Filed: Mar. 22, 2002

(51) Int. Cl.[7] .................. H01L 2/3205; H01L 21/4765; H01L 21/8238
(52) U.S. Cl. .................. 438/585; 438/231; 438/592
(58) Field of Search .................. 438/142, 231, 438/585, 592, 636, 706, 745

(56) References Cited

U.S. PATENT DOCUMENTS

| 4,923,823 | A |   | 5/1990  | Kohno ............... 437/41  |
|-----------|---|---|---------|------------------------------|
| 5,030,589 | A |   | 7/1991  | Noda ............... 437/192  |
| 5,237,192 | A |   | 8/1993  | Shimura ............ 257/280  |
| 5,326,431 | A |   | 7/1994  | Kadomura ........... 156/659  |
| 5,741,718 | A |   | 4/1998  | Codama et al. ....... 437/41  |
| 6,027,959 | A | * | 2/2000  | En et al. ........... 438/142 |
| 6,066,567 | A | * | 5/2000  | En et al. ........... 438/706 |
| 6,087,271 | A | * | 7/2000  | En et al. ........... 438/745 |
| 6,136,636 | A | * | 10/2000 | Wu .................. 438/231 |
| 6,200,863 | B1|   | 3/2001  | Xiang et al. ........ 438/286 |
| 6,296,974 | B1| * | 10/2001 | Lin .................... 430/5 |
| 6,316,348 | B1| * | 11/2001 | Fu et al. ........... 438/636 |
| 2003/0022446 | A1 | | 1/2003 | Lee et al.                    |

\* cited by examiner

Primary Examiner—John F. Niebling
Assistant Examiner—Walter L. Lindsay, Jr.
(74) Attorney, Agent, or Firm—Timothy M. Honeycutt

(57) ABSTRACT

Various methods of manufacturing are disclosed. In one aspect, a method of manufacturing is provided that includes forming an anti-reflective coating on a structure on a substrate. A first spacer and a second spacer are formed adjacent to the structure. The first spacer covers a first portion of the substrate and the second spacer covers a second portion of the substrate. The anti-reflective coating is removed while the first and second spacers are left in place to protect the first and second portions of the substrate. The method provides for anti-reflective coating application and removal with reduced risk of active region damage.

25 Claims, 5 Drawing Sheets

METHOD OF REMOVING INORGANIC GATE ANTIREFLECTIVE COATING AFTER SPACER FORMATION

BACKGROUND OF THE INVENTION

1. Field of the Invention

This invention relates generally to semiconductor processing, and more particularly to methods of processing incorporating the use and removal of anti-reflective coating films.

2. Description of the Related Art

In a conventional process flow for forming a typical gate electrode stack used in field effect transistors, capacitors and other devices, an oxide layer is grown on a lightly doped silicon substrate and a layer of polysilicon is deposited on the oxide layer. The polysilicon layer and the oxide layer are then masked and anisotropically etched back to the upper surface of the substrate to define a gate electrode of polysilicon stacked on a gate dielectric layer of oxide.

The patterning of the polysilicon gate entails the formation of a photoresist mask on the deposited polysilicon film. A resist film is applied to the polysilicon layer and patterned into the desired shape for the poly gate/line. The resist patterning involves resist exposure followed by a stripping process. In the first step, the resist is exposed to light passed through a mask or reticle. The light changes the chemical properties of the resist, rendering the resist either soluble or insoluble in a solvent. The resist is then rinsed in the solvent to remove the soluble portions thereof. The exposure light is diffracted by passage through the reticle. As the diffracted light passes through the resist, some of the light rays are scattered while others strike underlying films and reflect upwards. The reflected light rays interfere with incoming rays and produce an interference pattern composed of a plurality of standing waves. The interference pattern can cause unwanted perturbations in the resist, such as stair-stepping and line width variations. The problem is more acute where the underlying film or films are highly reflective. Oxide and polysilicon represent two examples of such reflective films.

In order to reduce the deleterious effects of standing wave interference and light scattering produced by radiation reflected back from the substrate during photoresist exposure, an anti-reflective coating ("anti-reflective coating") is commonly formed on the polysilicon layer prior to the polysilicon gate etch. Following anti-reflective coating deposition, photoresist is applied to the polysilicon layer and patterned, i.e., exposed and developed, to establish the desired pattern for the gate. The anti-reflective coating and the polysilicon layer are then anisotropically etched to define the gate. The photoresist is stripped and the remaining portion of the anti-reflective coating covering the gate is removed. If not removed, the anti-reflective coating may interfere with subsequent silicidation or contact formation.

Silicon oxynitride and silicon nitride are two materials frequently used for anti-reflective coating films. One conventional process of anti-reflective coating film removal involves a two-step acid bath dip process. Initially, the anti-reflective coating film is subjected to a hot bath of light concentration HF at about 65 to 85° C. Next, a dip in hot phosphoric acid is performed, again at about 65 to 85° C. If the composition of the anti-reflective coating is not anticipated to include oxide, then the HF dip is sometimes skipped.

A number of disadvantages are associated with conventional anti-reflective coating removal processing. To begin, the hot baths subject the substrate and the polysilicon lines to one or more thermal shocks. In sub-micron processing, such thermal shocks can lead to crystalline dislocations in the lattice structures of the substrate and the overlying polysilicon lines. Such crystalline defects may lead to line lift-off and device failure during subsequent processing steps. Another disadvantage is variations in the linewidth of the polysilicon lines. The hot acid baths will attack the sidewalls of the polysilicon gates or lines to some degree. If the amount of attack is known and repeatable, then the design rules may account for the loss. However, consistency in sidewall attack has proved difficult to attain. The difficulty stems from the fact that the acid solutions can be quickly depleted of reactants. Thus, successive lots of substrates may be subjected to acid baths with different compositions.

Another conventional process utilizes dry plasma etching to remove the anti-reflective coating layer. This type of process may avoid the thermal shocks associated with hot dips. However, the plasma can attack and create recesses in the silicon adjacent to the gate stack. This occurs because the conventional dry etch anti-reflective coating removal process is performed after gate etch but before other films, such as refractory metals, are applied over the exposed portions of the substrate. The recesses may impact device performance, particularly if they form in very close proximity to the gate stack.

The present invention is directed to overcoming or reducing the effects of one or more of the foregoing disadvantages.

SUMMARY OF THE INVENTION

In accordance with one aspect of the present invention, a method of manufacturing is provided that includes forming an anti-reflective coating on a structure on a substrate. A first spacer and a second spacer are formed adjacent to the structure. The first spacer covers a first portion of the substrate and the second spacer covers a second portion of the substrate. The anti-reflective coating is removed while the first and second spacers are left in place to protect the first and second portions of the substrate.

In accordance with another aspect of the present invention, a method of manufacturing is provided that includes forming an anti-reflective coating containing silicon and nitrogen on a conductor layer on a substrate. The conductor layer is etched to form a gate. An insulating layer is formed on the anti-reflective coating, the gate and the substrate. A first spacer and a second spacer are formed on the insulating layer adjacent to the gate. The first spacer is positioned over a first portion of the substrate and the second spacer is positioned over a second portion of the substrate. The anti-reflective coating is removed while the first and second spacers are left in place to protect the first and second portions of the substrate.

accordance with another aspect of the present invention, a method of manufacturing is provided that includes forming an anti-reflective coating containing silicon and nitrogen on a conductor layer on a substrate. The conductor layer is etched to form a gate. An oxide layer is formed on the anti-reflective coating, the gate and the substrate. A first silicon nitride spacer and a second silicon nitride spacer are formed on the insulating layer adjacent to the gate. The first spacer is positioned over a first portion of the substrate and the second spacer is positioned over a second portion of the substrate. The anti-reflective coating is removed while the first and second spacers are left in place to protect the first and second portions of the substrate by etching the anti-reflective coating selectively to the substrate and the oxide layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
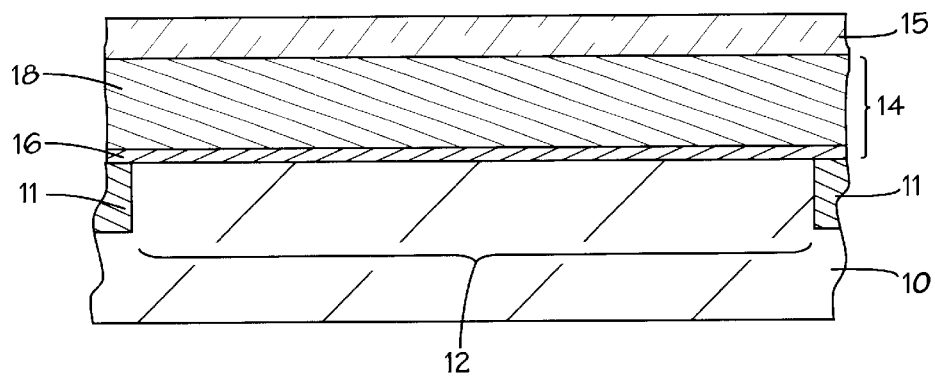
FIG. 1 is a cross-sectional view of an exemplary substrate depicting formation of a laminate structure thereon in accordance with the present invention.

In the drawings described below, reference numerals are generally repeated where identical elements appear in more than one figure. Turning now to the drawings, FIGS. 1–9 illustrate successive cross-sectional views of a workpiece or substrate 10 undergoing processing in accordance with the present invention. Turning initially to FIG. 1, the substrate 10 may be a semiconductor wafer or other type of substrate used in circuit fabrication and may be composed of silicon, silicon-on-insulator or other widely used substrate materials. Initially, isolation structures 11 are formed on the substrate 10 with a lateral separation that defines an active region 12. The isolation structures 11 provide lateral electrical isolation and may be shallow trench isolation, field oxide, or other isolation structures. The skilled artisan will appreciate that if the substrate 10 were configured as semiconductor-on-insulator, the structures 11 could extend downward to an underlying insulating layer (not shown). In an exemplary embodiment, the structures 11 consist of shallow trench isolation structures, may be composed of silicon dioxide, tetra-ethyl-ortho-silicate, or other suitable isolation materials and may be formed using well-known damascene etching and fill techniques or the like.

Next, a structure 14 is formed on the substrate 10 and an anti-reflective coating 15 is formed on the structure 12. The structure may be virtually any type of structure used in integrated circuit fabrication, such as, for example, a gate electrode, a gate electrode stack, an interconnect layer, or other type of device to name just a few. In the illustrated embodiment, the structure 14 consist of a gate insulating layer 16 formed on the substrate 10 and an overlying conductor layer 18. Through subsequent processing, the gate insulating layer 16 and the conductor layer 18 will be patterned into a gate electrode stack.

The gate insulating layer 16 may be composed of a variety of insulating materials, such as for example, silicon dioxide, silicon nitride, hafnium oxide, zirconium oxide, titanium dioxide, $Ta_2O_5$, laminates of these or the like. The gate insulating layer 16 may be applied using well-known fabrication techniques, such as thermal oxidation, chemical vapor deposition ("CVD") or the like. In an exemplary embodiment, the layer 16 is formed by thermal oxidation with a thickness of about 15 to 150 Å.

The conductor layer 18 may be composed of a variety of conducting materials such as, for example, polysilicon, aluminum, copper, titanium, tantalum, gold, platinum, laminates or mixtures of these or the like. The conductor layer 18 may be applied using well-known fabrication techniques, such as CVD, physical vapor deposition, electrochemical means or the like. In an exemplary embodiment, the layer 18 is composed of polysilicon deposited by CVD to a thickness of about 250 to 1,500 Å. If the layer 18 is composed of polysilicon, conductivity may be provided by in-situ doping or via subsequent impurity implantation or diffusion.

The anti-reflective coating 15 is advantageously composed of an inorganic material that possesses desirable optical properties for subsequent lithographic patterning of a photomask with reduced standing wave and interference effects. Exemplary materials include, for example, silicon oxynitride and silicon-rich nitride. In an exemplary embodiment, the anti-reflective coating 15 is composed of silicon oxynitride and is applied to a thickness of about 150 to 1,200 Å.

Figure 2:
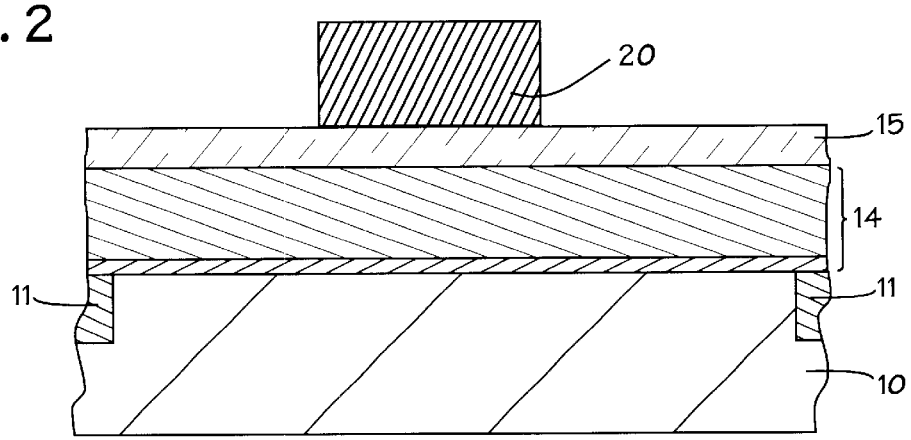
FIG. 2 is a cross-sectional view like FIG. 1 depicting formation of a mask on the structure in accordance with the present invention.

As shown in FIG. 2, a mask 20 is patterned on and with the aid of the anti-reflective coating 15. The mask 20 may be composed of any of a variety of suitable lithographic masking materials, such as, for example, positive resist, negative resist or other materials that may benefit from the use of an underlying or bottom anti-reflective coating 15. The mask 20 is patterned with a desired layout for the underlying structure 14 that will be patterned in a subsequent step.

Figure 3:
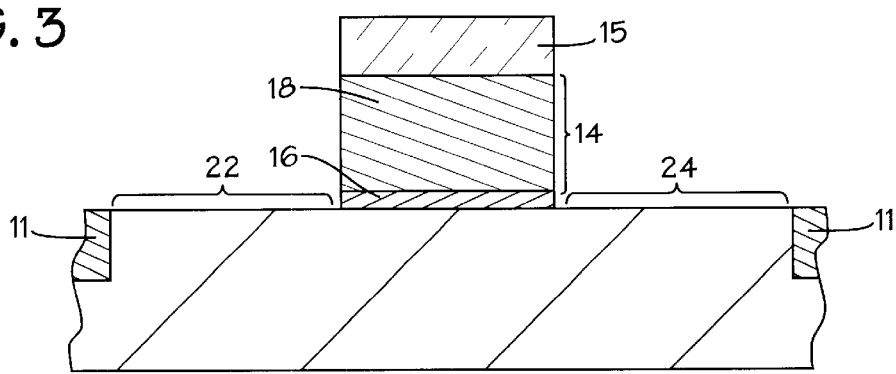
FIG. 3 is a cross-sectional view like FIG. 2 depicting definition of a gate stack from the laminate structure in accordance with the present invention.

Referring now to FIG. 3, selected portions of the structure 14 are removed with the mask 20 serving as a protective masking layer in order to define a gate stack. The removal may be by directional etching, non-directional etching, laser ablation or the like. In an exemplary embodiment, the structure 14 is patterned by anisotropic etching using, for example, $SF_6$ in a reactive ion etch. Following the patterning of the structure 14, the mask 20 may be removed using well-known stripping techniques as shown. If the process flow were to follow a conventional processing technique at this point, the anti-reflective coating 15 would be removed by means of a dry plasma etch that, as described above, can lead to unwanted attack of the exposed areas 22 and 24 of the substrate 10 adjacent to the structure 14. However, the process of the present invention provides for the delayed removal of the anti-reflective coating 15 with reduced unintentional damage of the areas 22 and 24 of the substrate 10.

Figure 4:
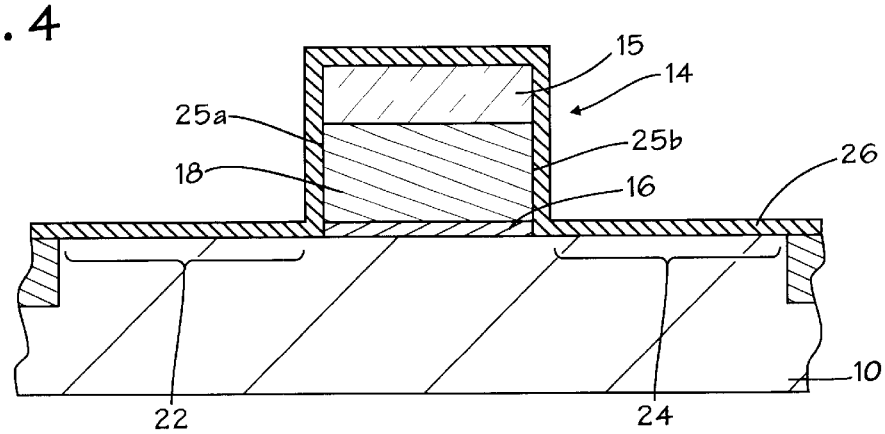
FIG. 4 is a cross-sectional view like FIG. 3 depicting formation of an insulating layer on the gate stack in accordance with the present invention.

As shown in FIG. 4, an insulating layer 26 is formed on the structure 14 and portions of the substrate 10 that include the areas 22 and 24 adjacent to the structure 14. The insulating layer 26 serves as an interface between the sidewalls 25a and 25b of the conductor layer 18 and subsequently formed spacers to be described below. This interfacial quality may be advantageous if the material selected for the later-formed spacers does not exhibit optimal adhesion to the conductor layer 18. The insulating layer 26 is also designed to function as an etch stop during definition of the later-formed spacers. Depending upon the compositions of the insulating layer 26 and the later-formed spacers, the insulating layer 26 may also serve as an oxidation barrier to limit the lateral oxidation of the conductor layer 18. Finally, the insulating layer 26 may serve as a means of repairing damage to the edges of the gate insulating layer 16 that may occur during ion implants and etches. Exemplary materials, include for example, oxide, silicon nitride, silicon oxynitride or the like. In an exemplary embodiment, the insulating layer 26 is advantageously composed of oxide. Wet or dry oxidation or chemical vapor deposition ("CVD") may be used to form the layer 26 with a thickness of about 20 to 200 Å. For example, plasma enhanced CVD may be used with or without post-deposition densification anneal. Optionally, the substrate 10 may be exposed to an oxygen atmosphere at about 850 to 1100° C. for about 20 to 60 seconds in a rapid thermal anneal process. However, if silicon nitride or oxynitride is selected, then chemical vapor deposition CVD may be used to deposit the layer 26.

Figure 5:
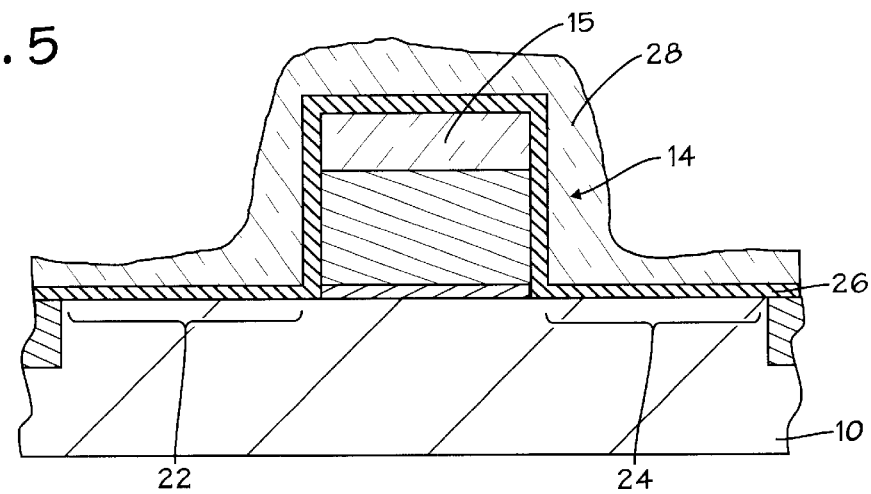
FIG. 5 is a cross-sectional view like FIG. 4 depicting formation of an insulating film over the gate stack in accordance with the present invention.
Figure 6:
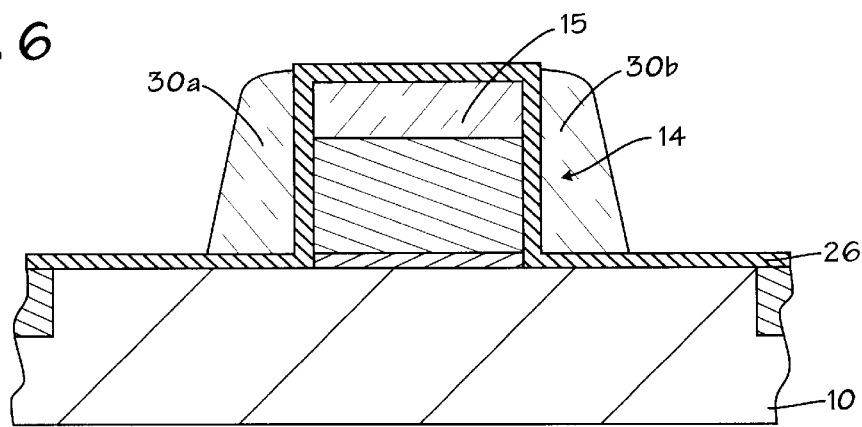
FIG. 6 is a cross-sectional view like FIG. 5 depicting definition of spacers from the insulating film in accordance with the present invention.

Referring now to FIGS. 5 and 6, an insulating film 28 is formed on the substrate 10 over the structure 14. Through subsequent processing, the insulating film 28 is etched to define insulating spacers 30a and 30b. The insulating film 28 may be composed of, for example, oxide, silicon nitride, silicon oxynitride or the like. In an exemplary embodiment, the insulating film 28 is composed of silicon nitride and may be applied by CVD to a thickness of about 300 to 1,500 Å. The spacers 30a and 30b may be defined by performing directional etching, laser ablation or the like. The insulating layer 26 protects the underlying areas 22 and 24 of the substrate 10 during the spacer etch. In an exemplary embodiment utilizing silicon nitride, the spacers 30a and 30b are defined by anisotropically etching the layer 26 in a dry plasma etching process. Exemplary parameters may be as follows:

TABLE 1

| Etch mixture | $CF_4$ and HBr |
|---|---|
| Ratio of $CF_4$ flow rate to HBr flow rate | about 1:1 to 5:1 (by volume) |
| diluent gas (argon, nitrogen or the like) flow rate | about 0 to 70% (by volume) |
| pressure | about 20 to 200 mtorr |
| temperature | about room temperature |
| wafer chuck bias | yes |

Various fluorocarbon chemistries may be used as alternatives to $CF_4$. Endpoint may be timed or via emission spectroscopy.

Figure 7:
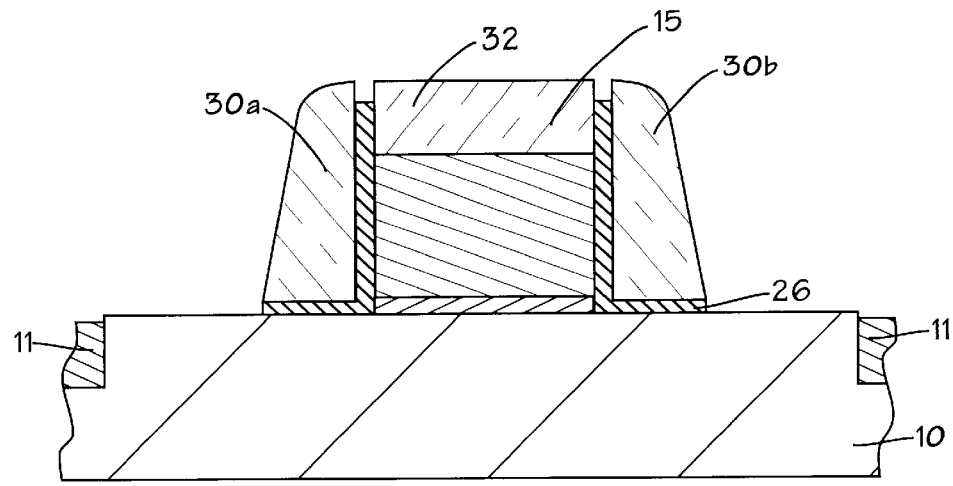
FIG. 7 is a cross-sectional view like FIG. 6 depicting removal of a portion of the insulating film to expose a portion of an anti-reflective coating in accordance with the present invention.

With the spacers 30a and 30b in place, the anti-reflective coating 15 may be removed. The spacers 30a and 30b as well as the insulating layer 26 protect the substrate 10 during the removal process. Initially, and as shown in FIG. 7, portions of the insulating layer 26 are removed to expose an upper surface 32 of the anti-reflective coating 15. The removal may be by directional etching, non-directional etching, laser ablation or the like. In an exemplary embodiment, an anisotropic dry-etch plasma process is used. The etch chemistry is selected to exhibit favorable selectivity to the substrate 10, the spacers 30a and 30b and the anti-reflective coating 15. Exemplary etchants include, for example, $C_4F_8$ and $CHF_3$. Exemplary parameters may be as follows:

TABLE 2

| $C_4F_8$ flow rate | about 5 to 30% (by volume flow rate) |
|---|---|
| diluent gas (argon, nitrogen or the like) flow rate | about 70 to 95% (by volume) |
| pressure | about 40 to 250 mtorr |
| temperature | about room temperature |
| wafer chuck bias | yes |

It is anticipated that the etch will consume some of the upper reaches of the isolation structures 11. However, the loss is buffered by the initial consumption of the portions of the insulating layer 26 that overlie the structures 11.

Figure 8:
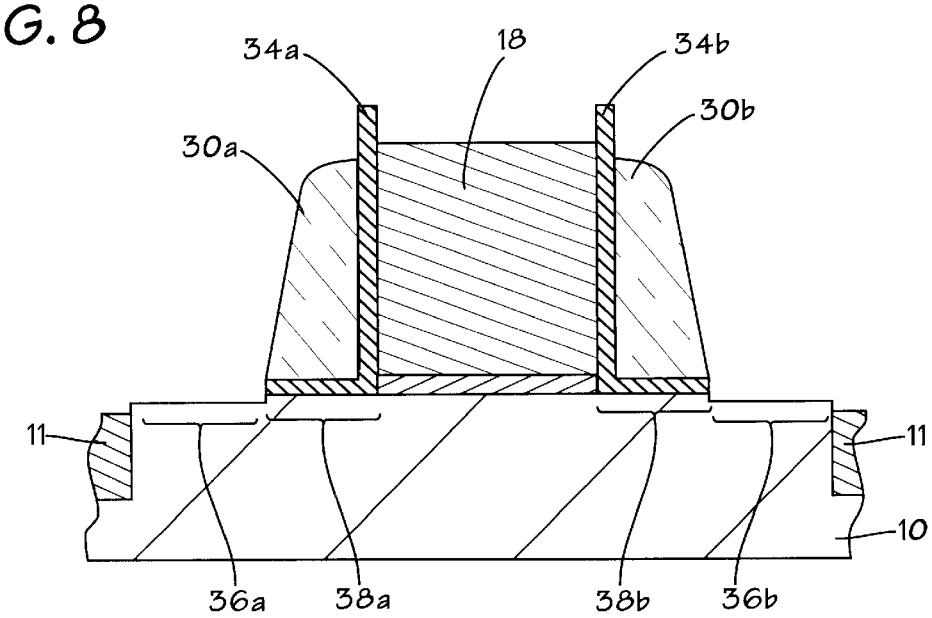
FIG. 8 is a cross-sectional view like FIG. 7 depicting removal of the anti-reflective coating in accordance with the present invention.

With the upper surface 32 of the anti-reflective coating 15 exposed, the anti-reflective coating 15 may be removed as shown in FIG. 8. The removal may be by directional etching, non-directional etching, laser ablation or the like. In an exemplary embodiment, the anti-reflective coating 15 is removed by anisotropic dry-etch plasma processing using chemistry that is selective to the substrate 10 and the isolation structures 11. Exemplary etchants include, for example, $CH_3F$ and $CH_3F/O_2$. Exemplary parameters may be as follows:

TABLE 3

| ratio of $CH_3F$ flow rate to oxygen flow rate | about 1:2 to 1:6 |
|---|---|
| total gas flow | about 40 to 250 sccm |
| pressure | about 50 to 200 mtorr |
| temperature | about room temperature |
| wafer chuck bias | yes |

Endpoint may be timed or via emission spectroscopy focused on a drop off in inorganic constitute emissions, such as CN or NH.

The etch removal of the anti-reflective coating 15 will typically remove an equivalent thickness of the upper portions of the spacers 30a and 30b and expose the conductor layer 18. The exposure of the conductor 18 at this stage provides for silicidation without need for a separate etch of the insulating layer 26. Since the etch is selective to the insulating layer 26, upwardly projecting portions 34a and 34b are left exposed after the etch. Some consumption of portions 36a and 36b of the substrate lateral to the spacers 30a and 30b as well as the isolation structures 11 is anticipated. However, portions 38a and 38b remain protected from etch attack.

Figure 9:
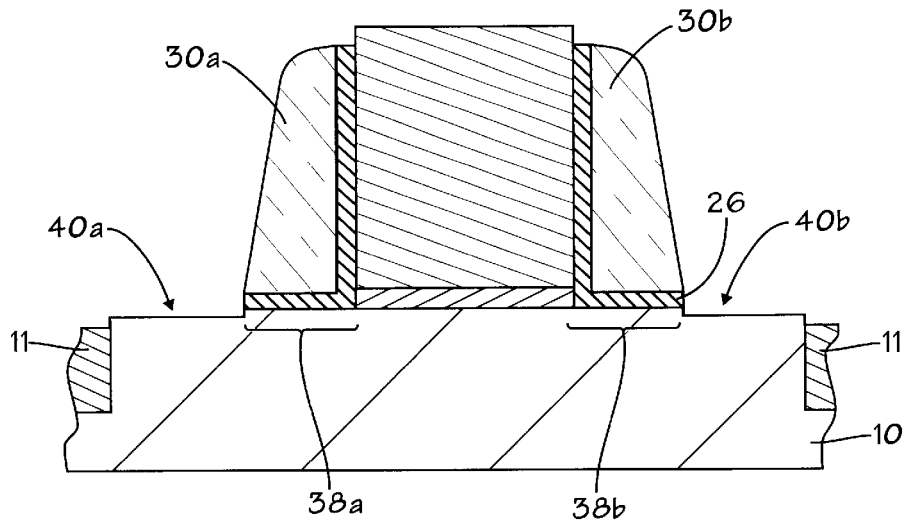
FIG. 9 is a cross-sectional view like FIG. 8 depicting removal of upwardly projecting portions of the insulating film in accordance with the present invention.

With the anti-reflective coating 15 removed, the remnants 34a and 34b of the insulating layer 26 may be removed as shown in FIG. 9 by a continuation of the removal process used to initially expose the upper surface 28 of the anti-reflective coating 15 as shown in FIG. 7. For example, the parameters set forth in Table 2 above may be used. However, wafer chuck bias may be eliminated. Shallow recesses 40a and 40b may form in the upper surface of the substrate 10 lateral to the portions 38a and 38b of the substrate 10 covered by the spacers 30a and 30b. Note, however, that the presence of the remnants of the sacrificial film 26 leave the most sensitive portions, that is, the portions 38a and 38b of the substrate 10 adjacent to the structure 14 intact during the removal of the anti-reflective coating 15.

With the anti-reflective coating 15 fully removed, the substrate 10 and the structure 14 may undergo further processing as desired to implement whatever circuit structures or functionalities are desired. For example, impurities may be introduced into the substrate 10 by diffusion, ion implantation or the like to implement source/drain regions, resistor structures, capacitor structures or the like.

Figure 10:
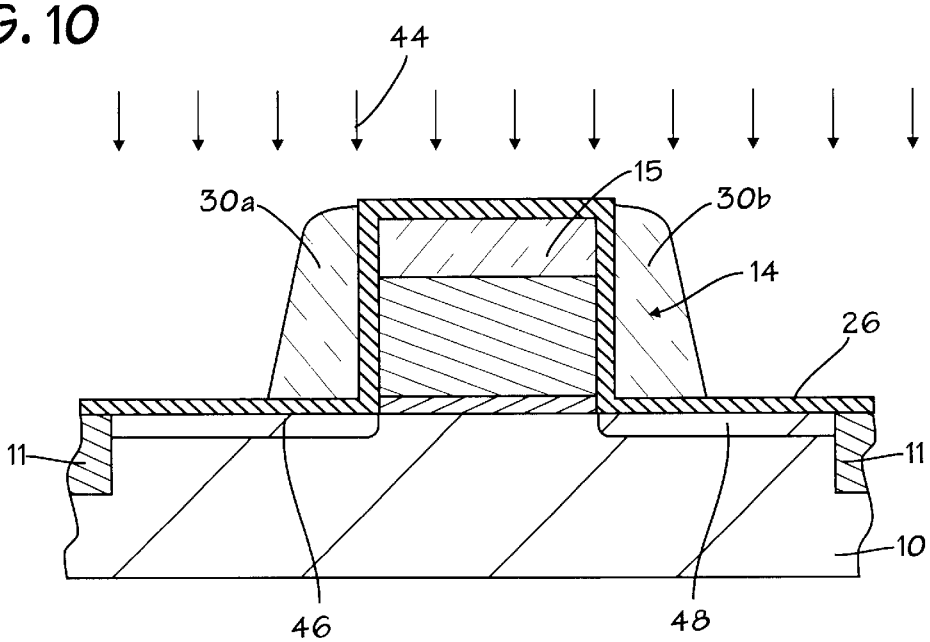
FIG. 10 is a cross-sectional view like FIG. 6 depicting an alternate exemplary embodiment of a process in accordance with the present invention.

An alternate exemplary process flow in accordance with the present invention may be understood by referring now to FIG. 10. The substrate 10 may be processed as described elsewhere herein to yield the isolation structures 11, the structure 14, the anti-reflective coating 15, the insulating layer 26 and the spacers 30a and 30b. However, in this illustrative embodiment, the anti-reflective coating 15 is left in place following the etch definition of the spacers 30a and 30b. Thereafter, implantation of impurities 44 may be performed to establish impurity regions 46 and 48 in the substrate 10. In this way, the insulating layer 26 may serve as an implant screen layer so that the impurity regions 46 and 48 may be established with relatively shallow junctions. The number and type of implants is largely a matter of design discretion. Following the impurity introduction, the substrate 10 may undergo further processing as described elsewhere herein and illustrated in an exemplary in fashion in FIGS. 7, 8 and 9.

Figure 11:
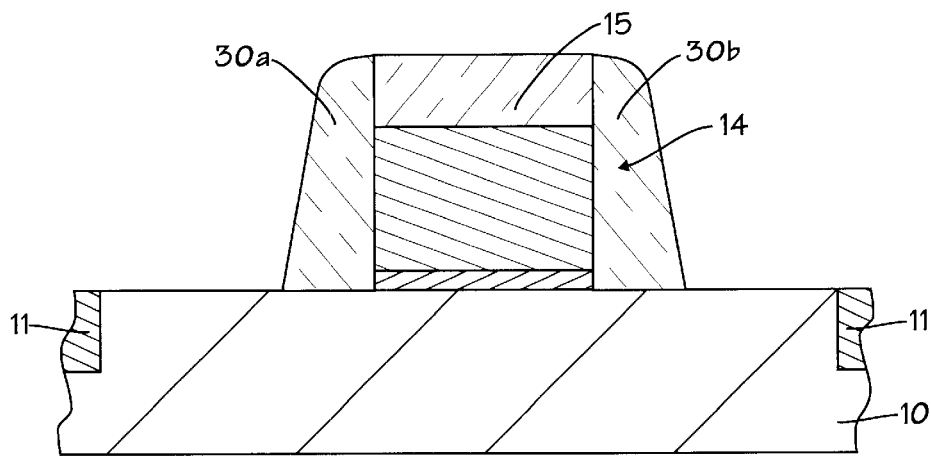
FIG. 11 is a cross-sectional view like FIG. 6 depicting another alternate exemplary embodiment of the process of the present invention.
Figure 12:
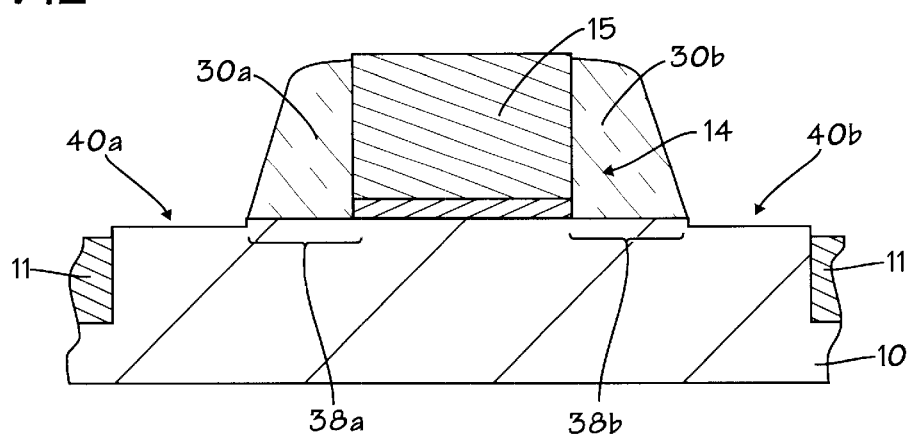
FIG. 12 is a cross-sectional view like FIG. 11 depicting removal of an anti-reflective coating in accordance with the present invention.

Another alternate exemplary process flow in accordance with the present invention may be understood by referring now to FIGS. 11 and 12. In this illustrative embodiment, the substrate 10 may be processed as described elsewhere herein to yield the isolation structures 11, the structure 14, the anti-reflective coating 15 and the spacers 30a and 30b. However, the insulating layer 26 described elsewhere herein is eliminated from the process flow. Following the etch definition of the spacers 30a and 30b, the anti-reflective coating 15 may be removed by the techniques described elsewhere herein. Some consumption of the substrate 10, resulting in the recesses 40a and 40b, and the isolation structures 11 is anticipated. However, like the other embodiments disclosed herein, portions 38a and 38b of the substrate 10 remain protected by the spacers 30a and 30b during the removal of the anti-reflective coating 15.

The skilled artisan will appreciate that the processes in accordance with the present invention facilitate the removal of inorganic anti-reflective coating layers with reduced risk of inadvertent damage to substrate active regions proximate gate or other types of circuit structures. Critical active region areas proximate, for example, gate electrode stacks, are protected by the sacrificial layer described elsewhere herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming an anti-reflective coating on a structure on a substrate;
   forming an insulating film on the anti-reflective coating, the structure and the substrate;
   forming a first spacer and a second spacer adjacent to the structure while leaving a portion of the insulating film covering the anti-reflective coating, the first spacer covering a first portion of the substrate and the second spacer covering a second portion of the substrate; and
   removing the anti-reflective coating while leaving the first and second spacers in place to protect the first and second portions of the substrate.

2. The method of claim 1, wherein the step of removing the anti-reflective coating comprises etching the insulating film to expose an upper surface of the anti-reflective coating and then etching the anti-reflective coating.

3. The method of claim 2, wherein the etching of the insulating film comprises etching selectively to the anti-reflective coating and the etching of the anti-reflective coating comprises etching selectively to the substrate.

4. The method of claim 3, wherein the etching of the anti-reflective coating comprises directional plasma etching.

5. The method of claim 3, comprising etching any portions of the insulating film projecting above the structure after the removal of the anti-reflective coating.

6. The method of claim 5, wherein the etching of any portions of the insulating film comprises directional plasma etching.

7. A method of manufacturing, comprising:
   forming an anti-reflective coating containing silicon and nitrogen on a conductor layer on a substrate;
   etching the conductor layer to form a gate;
   forming an insulating layer on the anti-reflective coating, the gate and the substrate;
   forming a first spacer and a second spacer on the insulating layer adjacent to the gate while leaving a portion of the insulating film covering the anti-reflective coating, the first spacer positioned over a first portion of the substrate and the second spacer positioned over a second portion of the substrate;
   removing the anti-reflective coating while leaving the first and second spacers in place to protect the first and second portions of the substrate.

8. The method of claim 7, wherein the step of removing the anti-reflective coating comprises etching the insulating film to expose an upper surface of the anti-reflective coating and then etching the anti-reflective coating.

9. The method of claim 8, wherein the etching of the insulating film comprises etching selectively to the anti-reflective coating and the etching of the anti-reflective coating comprises etching selectively to the substrate.

10. The method of claim 9, comprising etching any portions of the insulating film projecting above the gate after the removal of the anti-reflective coating.

11. The method of claim 10, wherein the etching of any portions of the insulating film comprises directional plasma etching.

12. The method of claim 9, wherein the etching of the anti-reflective coating comprises directional plasma etching.

13. The method of claim 7, wherein the insulating film comprises oxide and the first and second spacers comprise silicon nitride.

14. The method of claim 7, wherein the anti-reflective coating comprises silicon oxynitride.

15. The method of claim 7, comprising forming an impurity region in the substrate after formation of the gate but prior to removal of the anti-reflective coating.

16. The method of claim 15, wherein the forming of the impurity region comprises ion implantation.

17. A method of manufacturing, comprising:
   forming an anti-reflective coating containing silicon and nitrogen on a conductor layer on a substrate;
   etching the conductor layer to form a gate;
   forming an oxide layer on the anti-reflective coating, the gate and the substrate;

forming a first silicon nitride spacer and a second silicon nitride spacer on the insulating layer adjacent to the gate while leaving a portion of the oxide layer covering the anti-reflective coating, the first silicon nitride spacer positioned over a first portion of the substrate and the second silicon nitride spacer positioned over a second portion of the substrate;

removing the anti-reflective coating while leaving the first and second silicon nitride spacers in place to protect the first and second portions of the substrate by etching the anti-reflective coating selectively to the substrate and the oxide layer.

18. The method of claim 17, wherein the step of removing the anti-reflective coating comprises etching the oxide film to expose an upper surface of the anti-reflective coating and then etching the anti-reflective coating.

19. The method of claim 18, wherein the etching of the oxide film comprises etching selectively to the anti-reflective coating and the etching of the anti-reflective coating comprises etching selectively to the substrate.

20. The method of claim 19, comprising etching any portions of the oxide film projecting above the gate after the removal of the anti-reflective coating.

21. The method of claim 20, wherein the etching of any portions of the oxide film comprises directional plasma etching.

22. The method of claim 19, wherein the etching of the anti-reflective coating comprises directional plasma etching.

23. The method of claim 17, wherein the anti-reflective coating comprises silicon oxynitride.

24. The method of claim 17, comprising forming an impurity region in the substrate after formation of the gate but prior to removal of the anti-reflective coating.

25. The method of claim 24, wherein the forming of the impurity region comprises ion implantation.

* * * * *

UNITED STATES PATENT AND TRADEMARK OFFICE
CERTIFICATE OF CORRECTION

PATENT NO. : 6,703,297 B1 Page 1 of 1
DATED : March 9, 2004
INVENTOR(S) : Kay Hellig It is certified that error appears in the above-identified patent and that said Letters Patent is hereby corrected as shown below:

Column 2,
Line 53, insert -- In -- before "accordance".

Column 8,
Line 32, insert -- and -- after "substrate;".

Signed and Sealed this

Twenty-fifth Day of May, 2004

JON W. DUDAS
*Acting Director of the United States Patent and Trademark Office*